United States Patent
Kowarik et al.

(10) Patent No.: US 6,452,830 B2
(45) Date of Patent: Sep. 17, 2002

(54) MEMORY CONFIGURATION INCLUDING A PLURALITY OF RESISTIVE FERROELECTRIC MEMORY CELLS

(75) Inventors: Oskar Kowarik, Neubiberg; Kurt Hoffmann, Taufkirchen, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/767,805

(22) Filed: Jan. 22, 2001

Related U.S. Application Data

(63) Continuation of application No. PCT/DE99/02003, filed on Jul. 1, 1999.

(30) Foreign Application Priority Data

Jul. 22, 1998 (DE) .......................................... 198 32 991

(51) Int. Cl.[7] .............................................. G11C 11/22
(52) U.S. Cl. ........................ 365/145; 365/149; 257/295
(58) Field of Search ................................ 365/145, 149, 365/148; 257/295, 296

(56) References Cited

U.S. PATENT DOCUMENTS

| | | | | |
|---|---|---|---|---|
| 5,335,219 A | * | 8/1994 | Ovshinsky et al. | 365/113 |
| 5,517,445 A | * | 5/1996 | Imai et al. | 365/145 |
| 5,850,091 A | * | 12/1998 | Li et al. | 257/316 |
| 6,191,971 B1 | * | 2/2001 | Tanaka et al. | 365/145 |
| 6,323,513 B1 | * | 11/2001 | Schindler et al. | 257/296 |

FOREIGN PATENT DOCUMENTS

EP   0 167 143 A2   1/1986

OTHER PUBLICATIONS

International Publication WO 99/14761 (Kamp), dated Mar. 25, 1999.

* cited by examiner

*Primary Examiner*—David Nelms
*Assistant Examiner*—Gene N. Auduong
(74) *Attorney, Agent, or Firm*—Laurence A. Greenberg; Werner H. Stemer; Ralph E. Locher

(57) ABSTRACT

A memory configuration includes a plurality of resistive ferroelectric memory cells. Each of the memory cells includes a selection transistor and a storage capacitor. The selection transistor has a given zone of a first conductivity type. The storage capacitor has a first and a second electrode. The first electrode is supplied with a fixed cell plate voltage, the second electrode is connected to the given zone of the first conductivity type. A source and a drain of a MOS transistor are supplied with the fixed cell plate voltage. The channel of the MOS transistor has a channel length extending over at least two of the memory cells. The given zone of the first conductivity type is connected, via a resistor, to the channel of the MOS transistor such that the given zone is electrically connected to the first electrode of the storage capacitor via the resistor and the MOS transistor.

8 Claims, 3 Drawing Sheets

MEMORY CONFIGURATION INCLUDING A PLURALITY OF RESISTIVE FERROELECTRIC MEMORY CELLS

CROSS-REFERENCE TO RELATED APPLICATION

This application is a continuation of copending International Application No. PCT/DE99/02003, filed Jul. 1, 1999, which designated the United States.

BACKGROUND OF THE INVENTION

Field of the Invention

The invention relates to a memory configuration including a plurality of resistive ferroelectric memory cells.

Ferroelectric memory configurations, in which the cell plate voltage is fixed at half the supply voltage (Vcc/2) of the memory configuration, are distinguished by fast memory operations. However, in these memory configurations, the problem of a possible loss of the data stored in the storage capacitors arises. Since the cell nodes at the storage capacitors are floating as long as the selection transistors are in the off state or blocking state, and these cell nodes form parasitic pn junctions to the semiconductor substrate, leakage currents, which inevitably occur, cause, via these pn junctions, a decrease in the cell node voltage to ground voltage Vss. At the same time, the other nodes of the ferroelectric storage capacitors remain at the fixed cell plate voltage Vcc/2. As a result, the content of the ferroelectric storage capacitors can be corrupted by reprogramming.

In order to avoid this loss of data, the memory cells are refreshed, in a similar manner to what happens in DRAMs (Dynamic Random Access Memory Cells), before the content of the memory cells is corrupted or destroyed. The refresh is effected as follows: the bit lines of the memory configuration are precharged to half the supply voltage Vcc/2 and the cell nodes, through activation of the word lines, are likewise charged to half the supply voltage Vcc/2, so that 0 V drop across the storage capacitors.

Such a refresh is complicated and requires additional operations which should if possible be avoided.

U.S. Pat. No. 5,121,353 describes a memory configuration having ferroelectric memory cells that operates statically and can dispense with a refresh. For this purpose, however, each storage capacitor must be assigned two selection transistors which each have to be connected to different word lines, which makes this known memory configuration complicated.

SUMMARY OF THE INVENTION

It is accordingly an object of the invention to provide a memory configuration which overcomes the above-mentioned disadvantages of the heretofore-known memory configurations of this general type and which has a simple construction and which has resistive ferroelectric memory cells which are each configured in such a way that a leakage current at the cell node can no longer cause reprogramming of the respective memory cells, so that it is possible to dispense with a refresh of the memory cells.

With the foregoing and other objects in view there is provided, in accordance with the invention, a memory configuration, including:

a plurality of resistive ferroelectric memory cells, each of the resistive ferroelectric memory cells including a selection transistor and a storage capacitor;

the selection transistor having a given zone of a first conductivity type;

the storage capacitor having a first electrode and a second electrode, the first electrode being supplied with a fixed cell plate voltage, the second electrode being connected to the given zone of the first conductivity type;

a semiconductor substrate of a second conductivity type opposite the first conductivity type;

the selection transistor and the storage capacitor respectively being provided in or on the semiconductor substrate;

a MOS transistor having a source, a drain, and a channel, the source and the drain being supplied with the fixed cell plate voltage, the channel having a channel length extending over at least two of the resistive ferroelectric memory cells;

a resistor; and the given zone of the first conductivity type being connected, via the resistor, to the channel of the MOS transistor such that the given zone is electrically connected to the first electrode of the storage capacitor via the resistor and the MOS transistor.

In other words, a memory configuration according to the invention includes a plurality of resistive ferroelectric memory cells each including a selection transistor and a storage capacitor, one electrode of which is at a fixed cell plate voltage and the other electrode of which is connected to a zone of the selection transistor, the zone having a first conduction type, the selection transistor and the storage capacitor respectively being provided in and on a semiconductor substrate of a second conduction type, which is opposite to the first conduction type, the zone of the selection transistor which is connected to the storage capaciter is connected via a resistor to the channel of a MOS transistor whose channel length extends over at least two memory cells and to whose drain and source the fixed cell plate voltage is applied, so that the zone connected to the storage capacitor is electrically connected to one electrode of the storage capacitor via the resistor and the MOS transistor.

In the memory configuration according to the invention, the two electrodes of the storage capacitor, that is to say the so-called capacitance nodes, are thus connected to one another via a resistor and a connecting line formed by the MOS transistor. The connecting line formed of the MOS transistor having a long channel length is kept at the cell plate voltage.

The resistor should be dimensioned in such a way that its resistance is significantly less than the value of the reverse resistance—formed by the pn junction—of the selection transistor between the latter's drain and source and the semiconductor substrate, wherein the reading and writing operation should only be influenced extremely slightly by this resistor.

This ensures that, on the one hand, the reading and writing operation is virtually undisturbed by the resistor and, on the other hand, the leakage current of the parasitic pn junction to the semiconductor substrate is compensated for by the resistor, so that approximately the cell plate voltage is applied to both capacitance nodes of the ferroelectric storage capacitor. As a result, undesired reprogramming of the storage capacitor can no longer take place, so that it is possible to dispense with a refresh.

Consequently, what is essential about the invention is that that end or node of the resistor which is to be connected to that electrode of the storage capacitor which is at the fixed cell plate voltage is kept at the cell plate voltage via a MOS transistor whose channel length extends over a plurality of memory cells. Thus, by way of example, 20 to 100 memory cells are at the cell plate voltage via the drain and source regions of this MOS transistor via a contact and a line composed of aluminum, for example. Thus according to a preferred feature of the invention, the MOS transistor extends, with the channel, over a given number of the resistive ferroelectric memory cells. In particular, the channel of the MOS transistor extends over 20 to 100 of the resistive ferroelectric memory cells.

There are two embodiment variants for the configuration of the resistor and of the connecting line including the MOS transistor:

In the first variant, the resistor is realized by a suitable doping under the thick oxide next to the selection transistor, one end of this resistor being kept at the cell plate voltage via the MOS transistor having a long channel length and a gate voltage VZ being applied to the MOS transistor, while the cell plate voltage is applied to the drain and source of the MOS transistor. In this case, the gate voltage VZ is set in such a way that the cell plate voltage extends across the entire channel of the MOS transistor. In other words, according to a preferred feature of the invention, the semiconductor substrate has a doped region, the resistance value of the resistor is set by the doped region; and the MOS transistor is controlled by a gate voltage such that the fixed cell plate voltage can be applied entirely across the channel of the MOS transistor.

In the second variant, both the resistor at each memory cell and the feeding of the cell plate voltage are realized via the MOS transistor having a long channel length, the cell plate voltage being applied to the drain and source of the MOS transistor—as in the first variant.

A voltage VS is applied to the gate of the MOS transistor. The voltage is kept constant at a given value, so that either there results for each memory cell a current which corresponds to the conditions mentioned above for the resistor with regard to the value of the reverse resistance of the pn junction and the reading and writing operation and pulls the corresponding end of the resistor (resistance node) to the cell plate voltage. Alternatively, there results for each cell a current which corresponds to the conditions for the resistor and in addition, after each reading and/or writing operation and also in the event of the application and switching-off of the supply voltage for the memory configuration, brings the gate voltage VS to a value, in order that the individual electrodes of the storage capacitor in the respective memory cells are quickly pulled to the cell plate voltage.

The advantage of this last-mentioned method is that the electrodes of the storage capacitor are immediately brought to the cell plate voltage. In this case, every one of the MOS transistors having a long channel length can be switched; however, it is also possible to switch only those MOS transistors having a long channel length which belong to the respective bit line and are selected by a bit line decoder.

According to a further feature of the invention, the MOS transistor has a gate which is supplied with a given voltage such that a current to each of the resistive ferroelectric memory cells compensates for the leakage current of the parasitic pn junction to the semiconductor substrate.

In the memory configuration according to the invention, unintentional reprogramming caused by the leakage current of the parasitic pn junction to the substrate is precluded, so that a refresh is not necessary. It is possible to use normal word line decoders. Moreover, the capacitance of the word line is not increased. Unintentional reprogramming is likewise precluded when the supply voltage is switched off. No plug is necessary between, for example, an n+-conducting region at the resistor and that electrode of the storage capacitor which is at the fixed cell plate voltage, which lowers the demands on the technology during the fabrication of the memory configuration since an additional contact hole for the plug is not required. This also makes it possible to save space on the semiconductor substrate. In other words, the memory cell area is not enlarged in the memory configuration according to the invention by comparison with a standard cell. Finally, there is also no need for additional technology and process steps in order to realize the memory configuration according to the invention.

According to another feature of the invention, the selection transistor has a selection transistor drain and a selection transistor source; and the drain and the source of the MOS transistor, the selection transistor drain and the selection transistor source have an identical conductivity type.

According to yet another feature of the invention, the selection transistor has a selection transistor drain; and a plug connects the selection transistor drain to the second electrode of the storage capacitor.

According to another feature of the invention, the selection transistor has a selection transistor source; and a plug connects the selection transistor source to a bit line.

Other features which are considered as characteristic for the invention are set forth in the appended claims.

Although the invention is illustrated and described herein as embodied in a memory configuration including a plurality of resistive ferroelectric memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
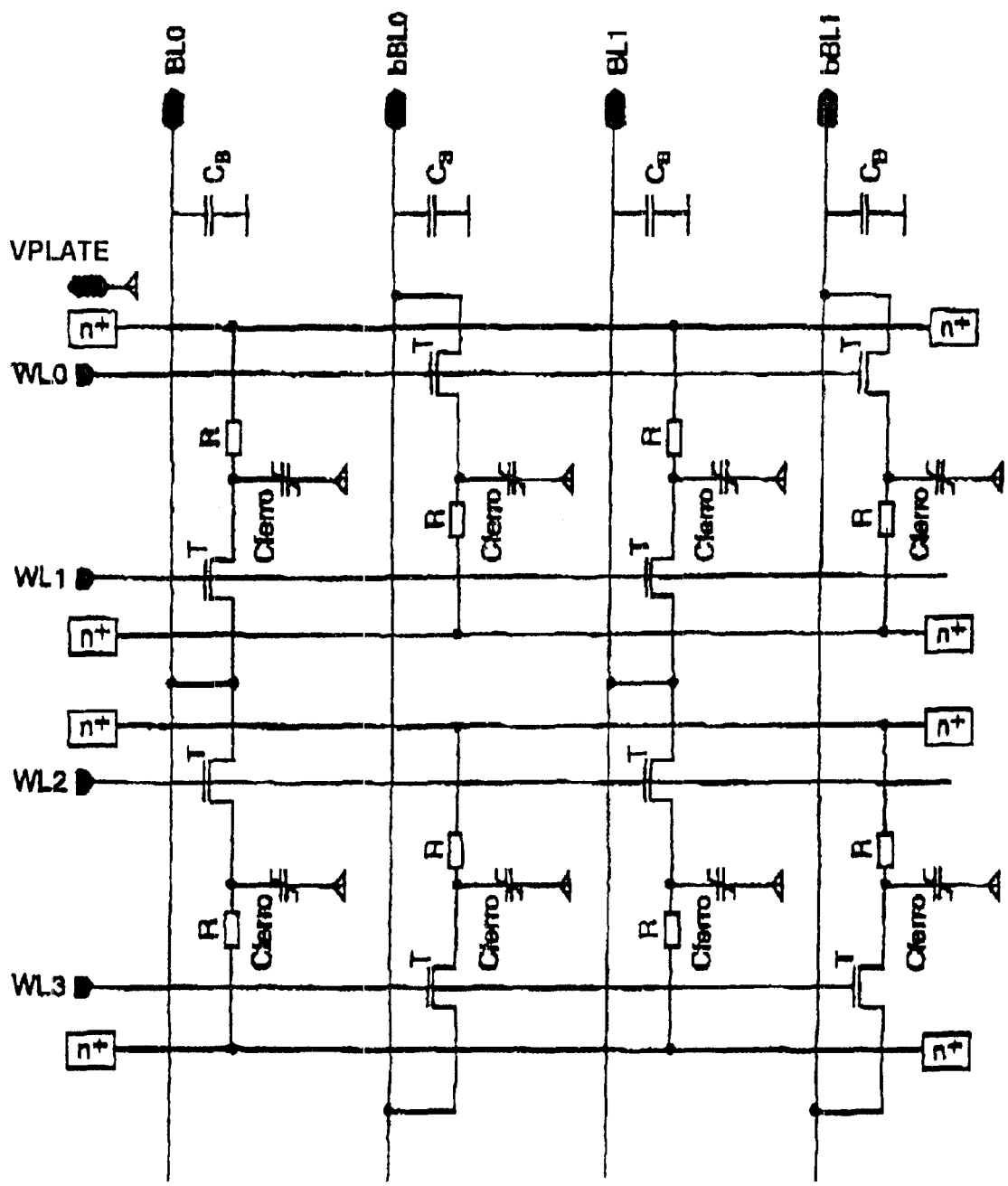
FIG. 1 is a circuit diagram of a memory configuration according to the invention.

Referring now to the figures of the drawings in detail and first, particularly, to FIG. 1 thereof, there is shown a memory cell field in a folded bit line architecture. The illustration shows especially the connection of the electrodes of the storage capacitor, the so-called capacitance nodes, via a suitable resistor and a connecting line which is at cell plate voltage and is realized by a MOS transistor having a long channel. It goes without saying that this connection of the capacitance nodes can, if appropriate, also be employed in a so-called open bit line architecture.

In detail, FIG. 1 illustrates word lines WL0, WL1, WL2 and WL3 and also bit lines BL0, bBL0, BL1 and bBL1— having capacitances $C_B$—for one-transistor/one-capacitor (1T1C) memory cells including selection transistors T and ferroelectric storage capacitors Cferro.

A fixed cell plate voltage is present at one electrode in each case of the storage capacitors Cferro, and is also fed to the other electrodes of the storage capacitors via a connecting line including a MOS transistor having $n^+$ source and respectively $n^+$ drain regions and a resistor R. In other words, the two capacitance nodes are connected to one another via the resistor R and the connecting line including the MOS transistor. In FIG. 1, these MOS transistors are indicated schematically by their source and drain regions $n^+$, the channel having a long channel length being routed between these regions $n^+$ and a gate voltage VZ (first exemplary embodiment) or VS (second exemplary embodiment) being applied to the gate electrode between these regions $n^+$. The connecting line is thus kept at the cell plate voltage VPLATE.

The resistor R is made in such a way that
(a) its resistance is significantly less than the value of the reverse resistance of the pn junction to the semiconductor substrate, and
(b) the reading and writing operation is only influenced extremely slightly by the resistor R.

This ensures that the reading and writing operation remains virtually undisturbed by the resistor R and the leakage current of the parasitic pn junction is compensated for by the resistor R, so that approximately the cell plate voltage VPLATE is present at both sides of the ferroelectric storage capacitors Cferro. As a result, undesired reprogramming of the storage capacitors Cferro can no longer take place.

That terminal or node of the resistor R which is to be connected to the cell plate voltage VPLATE is thus kept at the cell plate voltage VPLATE in each case via the MOS transistor (regions $n^+$) having a long channel. This long channel can extend over a plurality of memory cells, for example 20 to 100 memory cells. In all 20 to 100 memory cells, for example, the drain and source region $n^+$ of the MOS transistor is thus kept at the cell plate voltage VPLATE via a contact and a line composed of aluminum, for example.

Figure 2:
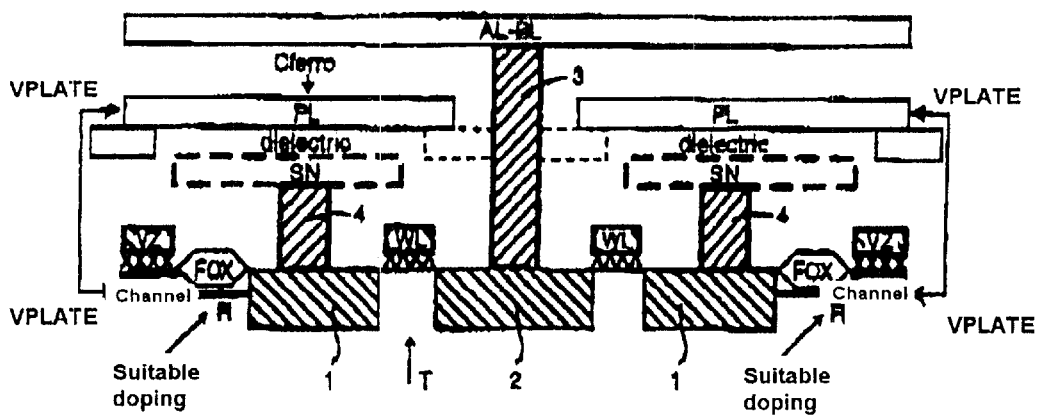
FIG. 2 is a schematic sectional view of a first exemplary embodiment of the memory configuration according to the invention.
Figure 3:
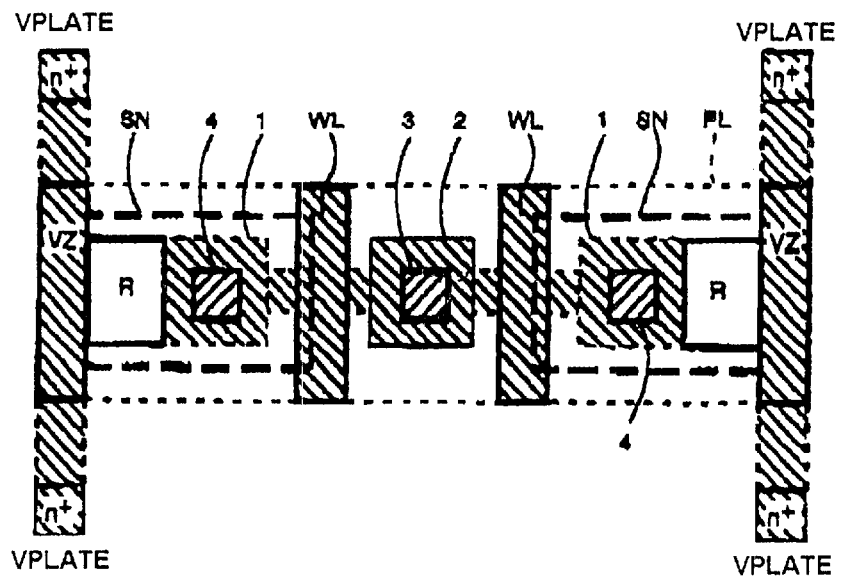
FIG. 3 is a schematic plan view of the memory configuration according to FIG. 2.

FIG. 2 then shows a schematic sectional view through a first exemplary embodiment of the invention, the plan view of which is illustrated in FIG. 3.

In FIG. 2, drain regions 1, which are $n^+$-doped for example, and a source region 2, which is likewise $n^+$-doped for example, are provided in the surface of a p-conducting semiconductor body. The source region 2 is connected to a bit line AL-BL, composed of aluminum for example. The connection is made via a contact plug 3 formed, for example, of polycrystalline silicon, which leads through an insulating layer (not shown in any specific detail) made of silicon dioxide, for example.

Above the channel between the drain and source regions 1 and 2, respectively, word lines WL are embedded in the insulating layer. The drain regions 1 are connected to storage nodes SN of storage capacitors via plugs 4 made, for example, of polycrystalline silicon. These storage capacitors include the storage nodes SN, a ferroelectric dielectric and common storage nodes PL (see the broken lines connecting the two storage nodes PL in FIG. 2), to which the cell plate voltage VPLATE is applied.

The resistor R is realized by a suitable doping under the thick oxide FOX, one end or node of the resistor R being connected to the drain region 1 and the other end of the resistor R leading to the MOS transistor having a long channel length, to whose gate a gate voltage VZ is applied.

This MOS transistor is indicated schematically by its gate ("VZ") and the word "channel" in FIG. 2. The MOS transistor lies between that end of the resistor R which is remote from the drain region 1 and the storage node PL. The cell plate voltage VPLATE is applied to the n+-type regions (drain and source) of the MOS transistor (cf. FIG. 3). The gate voltage VZ of the MOS transistor having a long channel length is set in such a way that the cell plate voltage VPLATE extends across the entire channel.

The exemplary embodiment of FIGS. 2 and 3 provides an open bit line structure. It goes without saying, however, that the invention can also be applied to a folded bit line structure.

Figure 4:
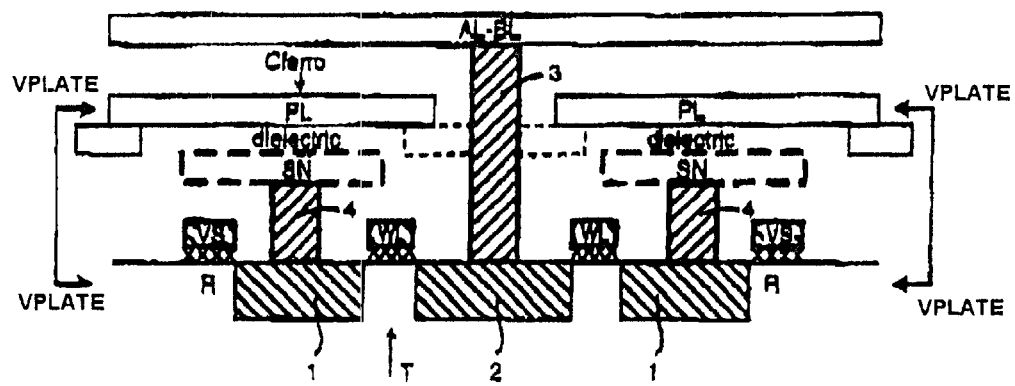
FIG. 4 is a schematic sectional view of a second exemplary embodiment of the memory configuration according to the invention.
Figure 5:
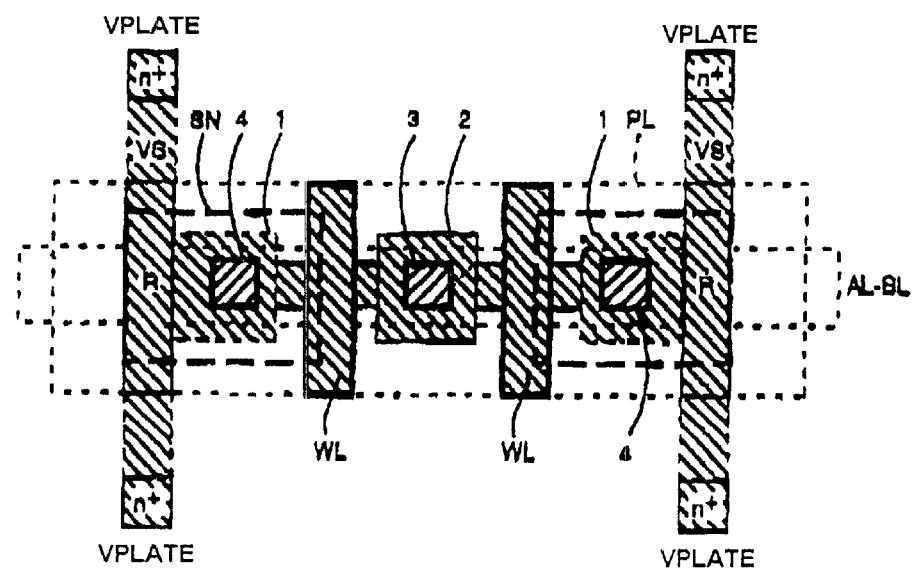
FIG. 5 is a schematic plan view of the memory configuration according to FIG. 4.

FIGS. 4 and 5 show a second exemplary embodiment of the invention, FIG. 4 being a schematic sectional view and FIG. 5 illustrating a plan view. The same reference symbols as in FIGS. 2 and 3 are used for mutually corresponding structural parts in FIGS. 4 and 5.

In the exemplary embodiment of FIGS. 4 and 5, the resistor R at each cell and the feeding of the cell plate voltage VPLATE are realized via the MOS transistor ($n^+$) having a long channel, the cell plate voltage VPLATE being applied to the drain and source region (cf. reference symbols "$n^+$") of the MOS transistor. The voltage VS is applied to the gate of the MOS transistor. The voltage VS is either:

(a) kept constant at a value, so that there results for each memory cell a current which corresponds to the above-mentioned conditions for the resistor R and keeps that end of the resistor R which is remote from the drain region 1 at the cell plate voltage VPLATE, or (b) is kept constant at a value, so that there results for each memory cell a current which corresponds to the above-mentioned conditions for the resistor R and in addition, after each reading and/or writing operation and also in the event of the application and switching-off of the supply voltage at the memory configuration, the gate voltage VS of the MOS transistor is brought to a value, in order that the individual storage nodes in the memory cells are quickly pulled to the cell plate voltage VPLATE.

Especially with the last-mentioned method, the storage nodes can immediately be brought to the cell plate voltage VPLATE. It is possible to switch every one of the MOS transistors having a long channel or, alternatively, only those MOS transistors having a long channel which belong to the respective bit line and are selected by a bit line decoder.

We claim:
1. A memory configuration, comprising:
a plurality of resistive ferroelectric memory cells, each of said resistive ferroelectric memory cells including a selection transistor and a storage capacitor;
said selection transistor having a given zone of a first conductivity type;
said storage capacitor having a first electrode and a second electrode, said first electrode being supplied with a fixed cell plate voltage, said second electrode being connected to said given zone of said first conductivity type;
a semiconductor substrate of a second conductivity type opposite said first conductivity type;
said selection transistor being provided in said semiconductor substrate, said storage capacitor being provided on said semiconductor substrate;
a MOS transistor having a source, a drain, and a channel, said source and said drain being supplied with the fixed cell plate voltage, said channel having a channel length extending over at least two of said resistive ferroelectric memory cells;

a resistor; and said given zone of said first conductivity type being connected, via said resistor, to said channel of said MOS transistor such that said given zone is electrically connected to said first electrode of said storage capacitor via said resistor and said MOS transistor.

2. The memory configuration according to claim 1, wherein:

said semiconductor substrate has a doped region, said resistor is set by said doped region; and said MOS transistor is controlled by a gate voltage such that the fixed cell plate voltage can be applied entirely across said channel of said MOS transistor.

3. The memory configuration according to claim 1, including:

a parasitic pn junction to said semiconductor substrate, said parasitic pn junction having a leakage current; and said MOS transistor having a gate supplied with a given voltage such that a current to each of said resistive ferroelectric memory cells compensates for the leakage current of said parasitic pn junction.

4. The memory configuration according to claim 1, wherein said MOS transistor extends, with said channel, over a given number of said resistive ferroelectric memory cells.

5. The memory configuration according to claim 4, wherein said channel of said MOS transistor extends over 20 to 100 of said resistive ferroelectric memory cells.

6. The memory configuration according to claim 1, wherein:

said selection transistor has a selection transistor drain and a selection transistor source; and said drain and said source of said MOS transistor, said selection transistor drain and said selection transistor source have an identical conductivity type.

7. The memory configuration according to claim 1, wherein:

said selection transistor has a selection transistor drain; and a plug connects said selection transistor drain to said second electrode of said storage capacitor.

8. The memory configuration according to claim 1, including:

a bit line;

said selection transistor having a selection transistor source; and a plug connecting said selection transistor source to said bit line.

* * * * *